United States Patent
Sanda et al.

(10) Patent No.: US 9,543,024 B2
(45) Date of Patent: Jan. 10, 2017

(54) NONVOLATILE MEMORY ERASURE TECHNIQUES

(75) Inventors: Hiroyuki Sanda, Palo Alto, CA (US); Kiran Pangal, Fremont, CA (US); Xin Guo, San Jose, CA (US); Kaoru Naganuma, Cupertino, CA (US)

(73) Assignee: Intel Corporation, Santa Clara, CA (US)

(*) Notice: Subject to any disclaimer, the term of this patent is extended or adjusted under 35 U.S.C. 154(b) by 180 days.

(21) Appl. No.: 13/995,145

(22) PCT Filed: Mar. 29, 2012

(86) PCT No.: PCT/US2012/031312
§ 371 (c)(1),
(2), (4) Date: Jun. 17, 2014

(87) PCT Pub. No.: WO2013/147818
PCT Pub. Date: Oct. 3, 2013

(65) Prior Publication Data
US 2014/0297924 A1    Oct. 2, 2014

(51) Int. Cl.
*G06F 12/00*        (2006.01)
*G11C 16/16*        (2006.01)
(Continued)

(52) U.S. Cl.
CPC ............ *G11C 16/16* (2013.01); *G11C 11/5635* (2013.01); *G11C 16/3445* (2013.01); *G06F 12/0246* (2013.01)

(58) Field of Classification Search
None
See application file for complete search history.

(56) References Cited

U.S. PATENT DOCUMENTS

| 5,920,508 A | 7/1999 | Miyakawa et al. |
| 6,771,541 B1 | 8/2004 | Park |

(Continued)

FOREIGN PATENT DOCUMENTS

| KR | 10-2001-0055445 A | 7/2001 |
| KR | 10-2001-0061470 A | 7/2001 |

OTHER PUBLICATIONS

International Preliminary Report on Patentability mailed Oct. 9, 2014 for International Application No. PCT/US2012/031312, 6 pages.

(Continued)

*Primary Examiner* — Brian Peugh
(74) *Attorney, Agent, or Firm* — Schwabe, Williamson & Wyatt, P.C.

(57) ABSTRACT

Embodiments of the present disclosure describe methods, apparatus, and system configurations for conditional pre-programming of nonvolatile memory before erasure. In one instance, the method includes receiving a request to erase information in a portion of the nonvolatile memory device, in which the portion includes a plurality of storage units, determining whether one or more storage units of the plurality of storage units included in the portion of the non-volatile memory device are programmed, pre-programming the portion of the non-volatile memory device if the one or more storage units are determined to be programmed, and erasing the pre-programmed portion of the non-volatile memory device. A number of determined programmed storage units may not exceed a predetermined value. Other embodiments may be described and/or claimed.

24 Claims, 5 Drawing Sheets

(51) Int. Cl.
*G11C 11/56* (2006.01)
*G11C 16/34* (2006.01)
*G06F 12/02* (2006.01)

(56) References Cited

U.S. PATENT DOCUMENTS

| | | | |
|---|---|---|---|
| 7,145,800 B2 | 12/2006 | Roohparvar | |
| 8,244,967 B2 * | 8/2012 | Ishibashi | G06F 12/0246 711/103 |
| 2009/0201728 A1 | 8/2009 | Hwang et al. | |
| 2012/0008396 A1 | 1/2012 | Park | |
| 2013/0097370 A1 * | 4/2013 | Ito | G11C 11/5621 711/103 |
| 2013/0132644 A1 * | 5/2013 | Choi | G06F 12/0246 711/103 |

OTHER PUBLICATIONS

International Search Report and Written Opinion for PCT/US2012/031312, mailed Nov. 23, 2012, 7 pages.

\* cited by examiner

NONVOLATILE MEMORY ERASURE TECHNIQUES

CROSS REFERENCE TO RELATED APPLICATIONS

The present application is a national phase entry under 35 U.S.C. §371 of International Application No. PCT/US2012/031312, filed Mar. 29, 2012, entitled "NONVOLATILE MEMORY ERASURE TECHNIQUES," which designates, among the various States, the United States of America, and the entire contents and disclosures of which are hereby incorporated by reference in their entireties.

FIELD

Embodiments of the present disclosure generally relate to the field of memory management, and more particularly, to erasure techniques for nonvolatile memory.

BACKGROUND

Nonvolatile memory devices, such as flash memory devices, may be read an instance (e.g., "page") at a time in a random access fashion, may be programmed an instance at a time in a sequential access fashion, but may be erased a "block" of the memory device at a time. In some situations, such as when a memory device is partially programmed, conventional erasure techniques may not ensure complete erasure of at least some of the previously programmed portions of a memory device. As a result, errors may occur in subsequent reprogramming and/or reading the memory device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
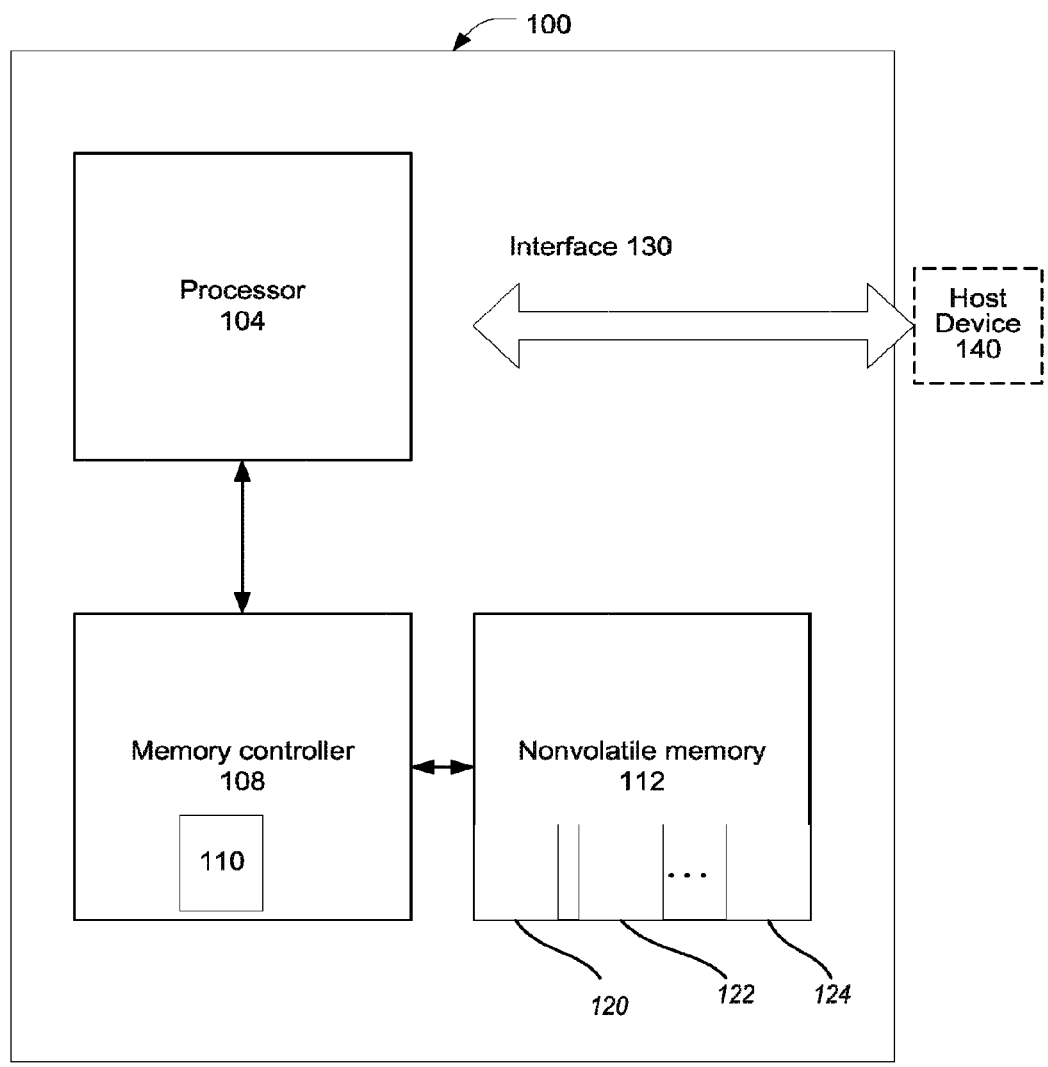
FIG. 1 illustrates an apparatus configured to implement conditional pre-programming and erasure of partially programmed nonvolatile memory in accordance with some embodiments.

Techniques are presented for erasing at least portions of nonvolatile memory comprising a nonvolatile memory device that may prevent memory programming errors associated with partial programming of the memory device that is done previous to the erasure of the nonvolatile memory.

In an embodiment, the programming may be performed by a memory controller. For certain types of nonvolatile memory (e.g., NAND memory type), some portions ("blocks") of the memory may not be fully erased after an erasure process is applied to the memory portions. Typically, full erasure implies that all storage units ("pages") comprising the block and that may be at least partially programmed are "erased" to a low voltage level that, for example, may correspond to a logical "1". The described techniques may ensure full erasure of partially programmed portions of nonvolatile memory.

For example, some pages of the nonvolatile memory block may have been programmed to a logical "0" having a corresponding high voltage level, while other pages (e.g., comprising a majority of pages of the block) may have been programmed to a logical "1" having a corresponding low voltage level. Accordingly, the resulting threshold voltage of the block (Vt) may be relatively low. When an erasure process is initiated (e.g., an erasure voltage pulse is applied to the nonvolatile memory block), one or more programmed pages may not be fully erased. Incomplete erasure may be caused by using a low erasure voltage that typically corresponds to a low level of the threshold voltage associated with the block. "Incomplete erasure" may mean that one or more not fully erased pages may have a corresponding "intermediary" voltage level, i.e., a level between a high voltage level corresponding to a page programmed to a logical "0" and a low voltage level corresponding to a page programmed to a logical "1". Conventional detection techniques may not detect incomplete erasure of at least some pages of the block. Accordingly, errors associated with incomplete erasure may occur during subsequent reprogramming of the block.

Some existing erasure techniques include pre-programming of the nonvolatile memory portions before erasure pulse is applied to the memory. Pre-programming constitutes "gang programming" of the memory portion (e.g., memory block) before erasure, where all pages of the memory block are programmed at the same time, usually setting Vt of all pages of the block to a same voltage level, thus ensuring that subsequent erasure pulse applied to the memory block provides uniform erasure of all pages. However, unconditional pre-programming of all pages in the memory block, typically used for multiple-level cell (MLC) NAND memory types, causes charge loss and fast degradation of a memory unit, thus reducing endurance capability of the nonvolatile memory device. Furthermore, pre-programming of single-level cell (SLC) NAND memory types that usually require high endurance capability is typically not applied due to high degradation resulting from frequent and unconditional "gang programming" of the memory.

The described techniques use conditional pre-programming of memory blocks to be erased. In one embodiment, conditional pre-programming may be applied to SLC NAND memory type. In embodiments, a memory controller may initiate erasure of at least a portion of a non-volatile memory device; determine whether the portion of the non-volatile memory device is partially programmed; pre-program the portion of the non-volatile memory device if the portion of the non-volatile memory device is determined to be partially programmed; and complete the initiated erasure of the portion of the non-volatile memory device. The memory controller may determine whether the portion of the non-volatile memory device is partially programmed, for example, by determining whether a number of pages of the portion that are programmed is less than a pre-determined threshold value. Generally, for each nonvolatile memory block that needs to be erased, the number of pages of the block that have been programmed, i.e., whether the memory block has been partially programmed, may be determined. For example, for a block consisting of 128 pages, a number of programmed pages may not exceed a determined threshold value (e.g., 10 pages). If it is determined that a number of programmed pages is more than one, but less than a predetermined threshold value, pre-programming of the memory block may be executed.

Block pre-programming may program, substantially uniformly, all pages of the memory block at once, for example, by putting the pages in an intermediate threshold voltage between logical "0" state and logical "1" state. This may be accomplished by applying a voltage of a determined level to the memory block. As a result, threshold voltage of the memory block Vt then may increase up to a level approximating, for example, a voltage level corresponding to an intermediate threshold voltage between logical "0" state and logical "1" state. Thus, no page may be left in the "1" state and the pre-programmed memory block may be prepared for subsequent full erasure. For example, one or more (when necessary) voltage pulses may be applied to the memory block in order to fully erase the memory. Accordingly, subsequent re-programming of the memory block may avoid errors associated with undetected partially erased pages.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Various entities may be introduced and described with respect to the operations they perform. It will be understood that these entities may include hardware, software, and/or firmware elements that are cooperatively configured to provide the described operations.

FIG. 1 illustrates an apparatus 100 in accordance with some embodiments. The apparatus 100 may include a processor) 104, coupled with a memory controller 108 that is, in turn, coupled with a nonvolatile memory 112. The memory controller 108 may include control logic 110 configured to perform the memory access and memory pre-programming and erasure operations described herein. In various embodiments, the control logic 110 may be external to the memory controller 108. The apparatus 100 may include, or be coupled with, a personal computer, a tablet computer, a digital camera, a mobile phone, a video game, a personal digital assistant, or any device having an associated nonvolatile memory such as memory 112.

In an embodiment, the apparatus 100 may be a solid-state drive (SSD), which may be configured to be coupled via interface 130 with a host device 140, including, but not limited to, various computing and/or consumer electronic devices/appliances, such as desktop, laptop, or tablet computers. To that end, the interface 130 may comprise any suitable interface for coupling the memory device 100 to the host device 140, such as, for example, but not limited to, a serial advanced technology attachment (SATA) interface, a serial attached SCSI (SAS) interface, a universal serial bus (USB) interface, a peripheral control interface (PCI), or other suitable device interface.

The nonvolatile memory 112 may include any type of nonvolatile flash memory, e.g., NAND single- or multiple level cell flash memory, NOR flash memory. In various embodiments, the nonvolatile memory 112 comprises phase-change memory. Phase-change memory may comprise vertically integrated memory cells in which a phase-change memory element is layered with an Ovonic Threshold Switch (OTS) in a cross-point array, or a Phase Change Memory with Switch (PCMS) device (not illustrated). The nonvolatile memory 112 may be other types of nonvolatile memory, for example any type of electrically erasable programmable read-only memory (EEPROM). Other examples of non-volatile memory may include read-only memory, ferroelectric RAM (F-RAM), magnetic computer storage devices (e.g. hard disks, floppy disks, and magnetic tape), optical discs, and the like. In an embodiment, the conditionally pre-programming techniques described herein and performed by the control logic 110 may be applied to a nonvolatile memory of SLC NAND type. The nonvolatile memory 112 may include one or more memory blocks 120, 122, 124, each block including one or more page (not shown).

The control logic 110 may be an entity, e.g., an application, an operating system, etc., associated with the apparatus 100 that is configured to generate memory access requests, e.g., a "read", a "write", or "erase" request. In an embodiment, an "erase" request may be initiated by the host device 140 (e.g., the "erase" request may be associated with a "write" request initiated by the host device 140) and may be directed to the nonvolatile memory 112 by the memory controller 108. In another embodiment, the memory controller 108 may initiate an "erase" request and execute the request in accordance with executable instructions with which the controller may be configured as described below. For example, the memory controller 108 may be configured to execute a conditional programming of partially programmed portions (memory blocks) of the nonvolatile memory 112 and subsequent erasure procedure of the conditionally programmed memory blocks as described herein.

FIGS. 2A-2G are diagrams illustrating some aspects of conditional programming of nonvolatile memory devices in accordance with some embodiments.

Figure 2A:
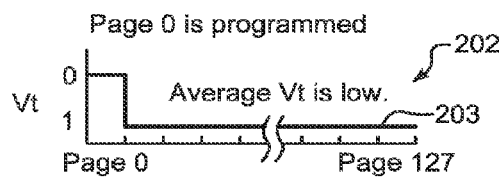
FIGS. 2A-2G are diagrams illustrating some aspects of conditional pre-programming of nonvolatile memory devices in accordance with some embodiments.

FIG. 2A is a diagram 202 illustrating a voltage level corresponding to each page of a partially programmed memory block of an SLC NAND memory device that comprises 128 pages. For purposes of illustration only, page 0 is programmed to "0" (high voltage level), while pages 1-127 are programmed to a logical "1" (low voltage level), as shown by graph 203. If erasure process is applied to the partially programmed block (diagram 204 shown in FIG.

2B), page 0 may not be fully erased and retain an "intermediary" voltage level illustrated by section 206 of graph 205.

The retaining of an "intermediary" voltage by previously programmed page 0 may occur, for example, because previously un-programmed pages 1-127 have already been fully erased. As a result, the erase level of the pages that are previously programmed is "shallower" than that of the fully programmed block (i.e., the resulting threshold voltage Vt may be lower than that of the fully programmed block). The "shallow" bit level may cause bit failures when the memory block is subsequently programmed. For example, if the memory block is subsequently programmed as illustrated by graph 211 of the diagram 210 (FIG. 2C), page 0 may still retain undetected "intermediary" voltage level 212 as opposed to desired level 214 corresponding to a logical "1", with which page 0 is supposed to be programmed. As a result, during a "read" operation of the memory block a bit failure associated with page 0 may occur.

Figure 2D:
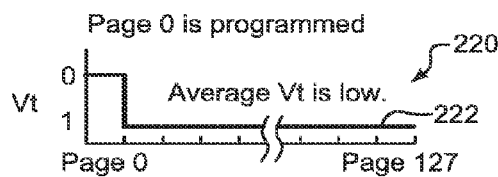
Figure 2E:
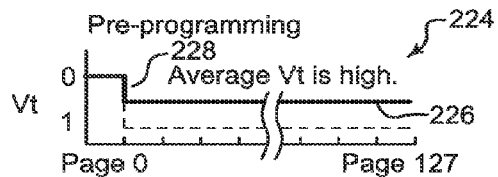
Figure 2B:
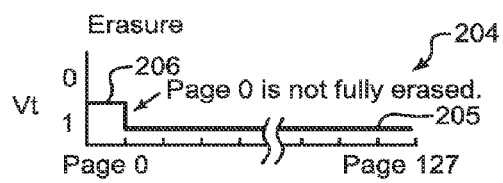
Figure 2F:
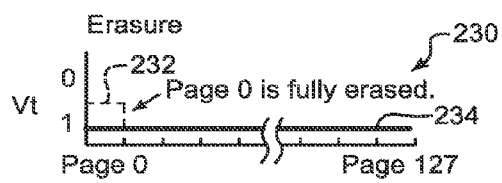
Figure 2C:
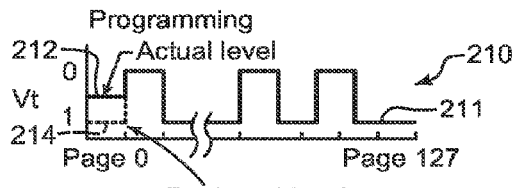

As described herein, partial programming may prevent a bit failure discussed above in reference to FIGS. 2A-2C. Suppose the memory block is programmed as shown in FIG. 2D. Similar to the instance described in reference to FIG. 2A, page 0 is programmed to a logical "0" (high voltage level), while pages 1-127 are programmed to a logical "1" (low voltage level), as shown by graph 222 of the diagram 220. If it is determined that the block is only partially programmed, e.g., one or more pages of the block (not exceeding a determined number of pages) are programmed, pre-programming may occur based on the results of such determination. In current example, only page 0 is programmed and has a high voltage level corresponding to a logical "0" as shown in FIG. 2D As illustrated in FIG. 2E, the memory block may be pre-programmed so as to increase average Vt of the block. Diagram 224 illustrates a voltage level for each page of the memory block. While page 0 retains a high voltage level corresponding to a logical "0" (228), pages 1-127 may be programmed to a certain voltage level that may be an intermediate voltage level between logical state "0" and logical state "1" , as shown by line 226. When erasure process is applied to the memory block (FIG. 2F), page 0 may be fully erased along with pages 1-127 as shown by the diagram 230, graph 234. The "intermediary voltage level" illustrated by dashed line 232 may be reduced to the low voltage level shown by 234, thus preventing a bit error corresponding to page 0. For pre-programmed block, erasure may require applying multiple voltage erasure pulses because the average Vt resulting from pre-programming may be relatively high as described above and illustrated by line 226 of FIG. 2E.

Figure 2G:
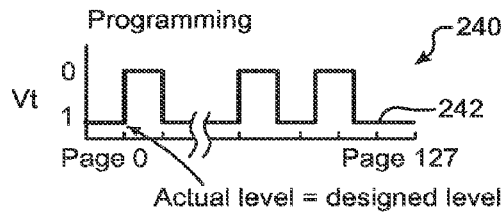

Accordingly, when the memory block is re-programmed as illustrated by diagram 240 in FIG. 2G, the actual voltage level of page 0 may be equal the desired (designed) voltage level corresponding to a logical "1", with which page 0 is supposed to be programmed (as shown by graph 242).

Figure 3:
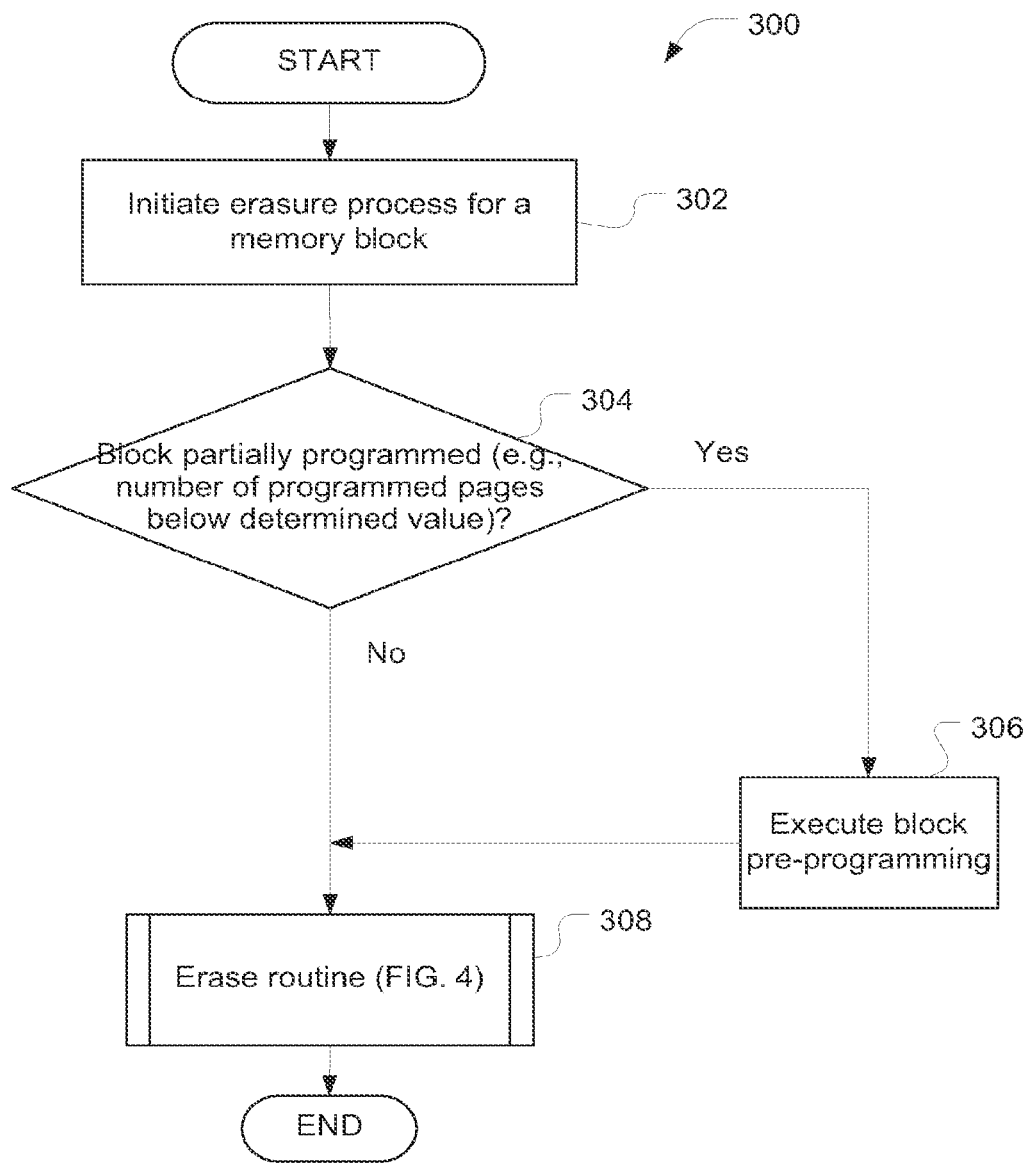
FIG. 3 is a process flow diagram depicting a conditional pre-programming of partially programmed nonvolatile memory devices in accordance with some embodiments.

FIG. 3 is a process flow diagram 300 depicting an operation of conditional programming of a memory block that may be performed by, e.g., the memory controller 108, in accordance with some embodiments. At block 302, the erasure process for a portion of a memory (e.g., a block) is initiated. In an embodiment, the erasure process may be initiated in response to a request, e.g., from the host 104.

At decision block 304, it is determined whether the memory block has been partially programmed. For example, it may be determined whether one or more pages of the block have been programmed, e.g., set to a logical "0" as shown in FIGS. 2A and 2D. In an embodiment, a total number of programmed pages may not exceed a determined value. For example, for a 128-page block, the total number of programmed pages may be between 10 and 20 pages.

If it is determined at block 304 that the memory block is partially programmed and that a total number of programmed pages does not exceed a determined value, at block 306 pre-programming of the memory block is initiated. Specifically, all pages of the block are programmed at the same time. The pre-programming may be accomplished by applying a voltage of a determined level to the memory block. For example, the applied pre-programming voltage may range from 10 to approximately 15 Volts. As described above in reference to FIG. 2E, the pre-programming may set a voltage for the memory block to a level that approximates an intermediate voltage level between logical "0" state and logical "1" state. After pre-programming is accomplished, the process 300 moves to block 308, at which an erase routine is executed. The erase routine is described in detail in reference to FIG. 4.

If it is determined at block 304 that the memory block is not partially programmed, the process 300 moves directly to the erase routine at block 308. In this case, pre-programming is not applied and the erase routine may be executed for the memory block. The process 300 then ends.

The conditional pre-programming technique described in reference to FIG. 3 provides for switching pre-program on and off depending on the programming condition of the memory block that needs to be erased. As briefly discussed above, the pre-programming of partially programmed memory blocks may keep the erase pulse count and the erase level the same as for fully programmed blocks. Therefore, high error bit events may be prevented. Furthermore, the probability of applying pre-programming to the partially programmed memory blocks prior to the erasure routine (the "Yes" branch of block 304) is small relative to the probability of applying erasure routine without pre-programming (the "No" branch of block 304). Accordingly, the impact on the memory endurance may be negligible.

Existing erasure techniques may not typically adopt pre-programming. For example, some erasure techniques may be configured to program a certain number (e.g., 30) of pages of a memory block when the number of programmed pages of the block is below a predefined number (e.g., 30) before the erasure is launched. This is done in order to increase erase pulse count and ensure a full erasure of the block. However, these techniques may substantially increase a total erase time for partial block programming due at least in part to extra time spent on page-by-page programming. In contrast, the conditional pre-programming technique described herein provides for a relatively small time penalty for erasure because all pages of a memory block are programmed at once.

Figure 4:
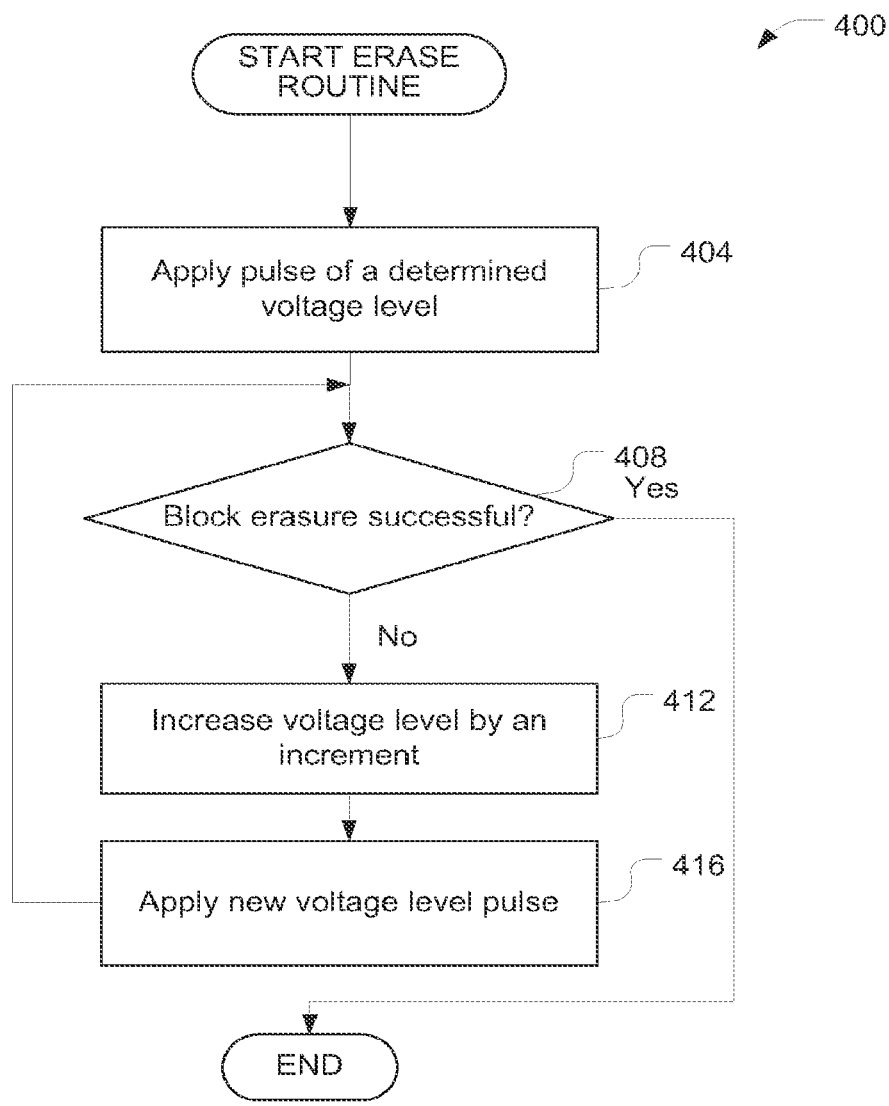
FIG. 4 is a process flow diagram depicting an example erasure process of partially programmed nonvolatile memory devices in accordance with some embodiments.

FIG. 4 is a process flow diagram 400 depicting a non-volatile memory erase routine in accordance with some embodiments. The memory erase routine may be done by the memory controller 108 as shown in FIG. 1.

At block 404, an initial erase voltage pulse of a determined voltage level is applied to a memory block. For example, erase starting voltage may range between −12 to −15 Volts.

At decision block 408 it is determined whether a memory block has been successfully, i.e., fully, erased. For example, a sum of resistance values of each page comprising the memory block may be calculated and compared to a threshold resistance value. In one example, a threshold resistance value may vary between 1 to 10 Mohm.

If at block 408 it is determined that the block erasure is unsuccessful, for example, if the sum resistance value of all pages exceeds the threshold resistance value the erase voltage pulse is incrementally increased at block 412. For example, an increment may range from approximately −0.1 to −0.5 Volt. At block 416, an incremented pulse is applied to the memory block. A typical pulse width may be about 200 us. After the new pulse is applied to the memory block, the process returns to decision block 408 in order to determine whether the erasure is successful. If erasure is determined to be successful at block 416, the process 400 ends.

Figure 5:
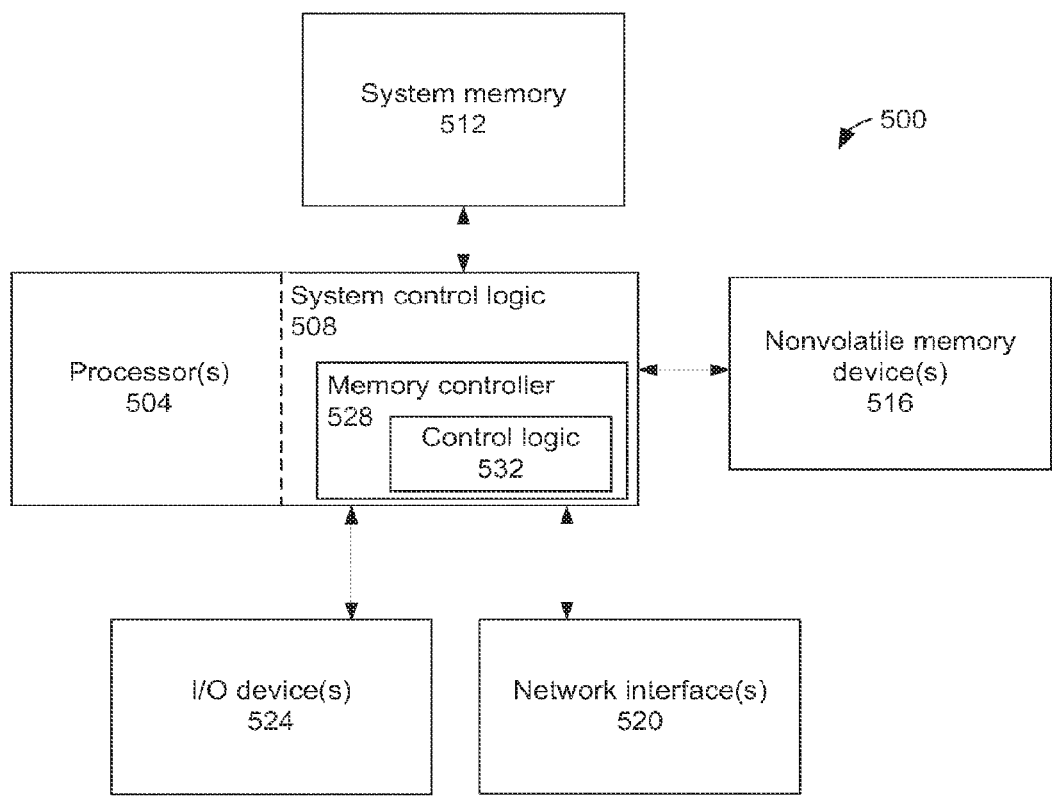
FIG. 5 illustrates a system configured to implement conditional pre-programming and erasure of partially programmed nonvolatile memory devices in accordance with some embodiments.

Embodiments of the present disclosure may be implemented into a system using any suitable hardware and/or software to configure as desired. FIG. 5 illustrates, for one embodiment, an example system 500 comprising processor(s) 504, system control logic 508 coupled to, or integrated with, at least one of the processor(s) 504, system memory 512 coupled to system control logic 508, nonvolatile memory device(s) 516 coupled to system control logic 508, network interface(s) 520 coupled to system control logic 508, and input/output device(s) 524 coupled to system control logic 508. The processor(s) 504 may include one or more single-core or multi-core processors. The processor(s) 504 may include any combination of general-purpose processors and dedicated processors (e.g., graphics processors, application processors, etc.). Applications, operating systems, etc., executing on the processor(s) 504 may be similar to host 104 and may issue the memory access requests directed to the nonvolatile memory device(s) 516 similar to that described above with respect to FIG. 1.

System control logic 508 for one embodiment may include any suitable interface controllers to provide for any suitable interface to at least one of the processor(s) 504 and/or to any suitable device or component in communication with system control logic 508. System control logic 508 for one embodiment may include one or more memory controller(s), e.g., memory controller 528, to provide an interface to system memory 512 and nonvolatile memory device(s) 516. System memory 512 may be used to load and store data and/or instructions, for example, for system 500. System memory 512 for one embodiment may include any suitable volatile memory, such as suitable dynamic random access memory (DRAM), for example.

The nonvolatile memory device(s) 516 may include one or more tangible, non-transitory computer-readable media used to store data and/or instructions, for example. The nonvolatile memory device(s) 516 may include nonvolatile memory similar to nonvolatile memory 112 that may be implemented in, for example, a solid state drive (SSD). The nonvolatile memory device(s) 516 may further include any suitable nonvolatile storage device(s), such as one or more hard disk drive(s) (HDD(s)), compact disk (CD) drive(s), and/or digital versatile disk (DVD) drive(s), for example.

The nonvolatile memory device(s) 516 may include a storage resource physically part of a device on which the system 500 is installed or it may be accessible by, but not necessarily a part of, the device. For example, a portion of the nonvolatile memory device(s) 516 may be accessed over a network via the network interface(s) 520.

The memory controller 528 may include control logic 532 that performs the memory access and memory pre-programming and erasure operations described herein. The control logic 532 may include instructions that are executed by at least one of the processor(s) 504 to perform the described operations.

System control logic 508 for one embodiment may include one or more input/output (I/O) controller(s) to provide an interface to network interface(s) 520 and I/O device(s) 524.

Network interface(s) 520 may provide one or more interface(s) for system 500 to communicate over one or more network(s) and/or with any other suitable device. Network interface(s) 520 may include any suitable hardware and/or firmware. Network interface(s) 520 for one embodiment may include, for example, a network adapter, a wireless network adapter, a telephone modem, and/or a wireless modem. For wireless communications, network interface(s) 520 may use one or more antennas. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The network interface(s) 520 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 2G, 3G, 4G, 5G, and beyond.

The system 500 may include a plurality of communication chips (not illustrated) for implementing various aspects of network interfacing. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The system 500 may include a display device, such as, for example, a cathode ray tube (CRT), liquid crystal display (LCD), light emitting diode (LED), or other suitable display device. The display device 1234 may be a touch screen display supporting touch screen features, and in various one of these embodiments, the I/O controller may include a touchscreen controller. In various embodiments, the display device may be a peripheral device interconnected with the system 500.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic, e.g., control logic 532, for one or more controller(s), e.g., memory controller 528, of system control logic 508 to form a System on Chip (SoC) package.

The I/O device(s) 524 may include user interfaces designed to enable user interaction with the system 500, peripheral component interfaces designed to enable peripheral component interaction with the system 500, and/or sensors designed to determine environmental conditions and/or location information related to the system 500. In various embodiments, the user interfaces could include, but are not limited to, a display, e.g., a liquid crystal display, a touch screen display, etc., a speaker, a microphone, a still camera, a video camera, a flashlight (e.g., a light emitting diode flash), and a keyboard. For embodiments including a display supporting touch screen features, the system 500 may include a touchscreen controller for facilitating control of the display. In various embodiments, the peripheral component interfaces may include, but are not limited to, a nonvolatile memory port, an audio jack, and a power supply interface. In various embodiments, the sensors may include, but are not limited to, a gyro sensor, an accelerometer, a proximity sensor, an ambient light sensor, and a positioning unit. The positioning unit may also be part of, or interact with, the network interface(s) 520 to communicate with components of a positioning network, e.g., a global positioning system (GPS) satellite.

In various embodiments, the system 500 may be a mobile computing device such as, but not limited to, a laptop computing device, a tablet computing device, a netbook, a desktop computing device, a smartphone, a mobile phone, a personal digital assistant, an ultra mobile personal computing device, a server, a printer, a scanner, a monitor, a set-top box, an entertainment control unit, a digital camera, a portable music player, a digital video recorder, etc. In various embodiments, the system 500 may be any other electronic device that processes data. In various embodiments, system 500 may have more or fewer components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
    a memory controller coupled with a non-volatile memory device and configured to:
        initiate erasure of at least a portion of the non-volatile memory device;
        determine whether the portion of the non-volatile memory device is partially programmed;
        pre-program the portion of the non-volatile memory device if the portion of the non-volatile memory device is determined to be partially programmed; and
        complete the initiated erasure of the portion of the non-volatile memory device.

2. The apparatus of claim 1, wherein the non-volatile memory device includes a single-level cell (SLC) NAND memory type.

3. The apparatus of claim 1, wherein the portion of the non-volatile memory device includes at least one block, the at least one block including a plurality of pages.

4. The apparatus of claim 3, wherein the memory controller is configured to determine whether the portion of the non-volatile memory device is partially programmed by determining whether one or more pages of the plurality of pages of the at least one block are programmed with data units such that at least one data unit is stored in each of the one or more pages.

5. The apparatus of claim 4, wherein the one or more pages that are determined to be programmed do not exceed a first threshold value.

6. The apparatus of claim 5, wherein the first threshold value is selected from a range from 10 to 20.

7. The apparatus of claim 3, wherein the pre-programming the portion of the non-volatile memory device includes applying a first voltage level to the at least one block.

8. The apparatus of claim 7, wherein the first voltage level is selected from a first range from 10 to 15 Volts.

9. The apparatus of claim 1, wherein the memory controller is configured to complete the initiated erasure of the portion of the non-volatile memory device by:
    applying a pulse having a second voltage level to the portion of the non-volatile memory device;
    determining whether the erasure of the portion of the non-volatile memory device is successful; and
    if the erasure of the portion of the non-volatile memory device is determined to be unsuccessful,
    incrementing the second voltage level by a determined increment value; and
    applying the pulse having the incremented second voltage level to the portion of the non-volatile memory device.

10. The apparatus of claim 9, wherein the second voltage level is selected from a second range of −12 to −15 Volts.

11. The apparatus of claim 9, wherein the determined increment value is selected from a third range of −0.1 to −0.5 Volts.

12. The apparatus of claim 9, wherein determining whether the erasure of the portion of the non-volatile memory device is successful includes determining whether a sum resistance value of all pages comprising the portion of the non-volatile memory device is below a second threshold value.

13. The apparatus of claim 12, wherein the second threshold value is selected from a range of 1 to 10.

14. A system comprising:
    a non-volatile memory device;
    a host device configured to issue a request to erase at least a portion of the nonvolatile memory device; and
    a memory controller coupled with the non-volatile memory device and configured to:
        in response to receiving the request to erase the portion of the non-volatile memory device, determine whether the portion of the non-volatile memory device is partially programmed;
        pre-program the portion of the non-volatile memory device if the portion of the non-volatile memory device is determined to be partially programmed; and
        erase the pre-programmed portion of the non-volatile memory device.

15. The system of claim 14, wherein the non-volatile memory device includes a single-level cell (SLC) NAND memory type.

16. The system of claim 14, wherein the portion of the non-volatile memory device includes at least one block, the block including a plurality of pages and wherein the memory controller configured to determine whether the portion of the non-volatile memory device has been partially programmed is further configured to determine whether one or more pages of the plurality of pages of the at least one block are programmed with data.

17. The system of claim 16, wherein a total number of pages that are determined to be programmed with data does not exceed a first threshold value.

18. The system of claim 14, wherein pre-programming the portion of the non-volatile memory device includes applying a first voltage level to the portion of the non-volatile memory device.

19. The system of claim 14, wherein the erasing the pre-programmed portion of the non-volatile memory device includes:
   applying a pulse having a second voltage level to the portion of the non-volatile memory device;
   determining whether the erasure of the portion of the non-volatile memory device is successful; and
   if the erasure of the portion of the non-volatile memory device is determined to be unsuccessful,
   incrementing the second voltage level by a determined increment value; and
   applying the pulse having the incremented second voltage level to the portion of the non-volatile memory device.

20. The system of claim 14, wherein the host device is selected from at least one of:
   a personal computer, a tablet computer, a digital camera, a mobile phone, a video game, and a personal digital assistant.

21. A method for erasing information in a non-volatile memory device, the method comprising:
   receiving, by a memory controller, a request to erase information in a portion of the nonvolatile memory device, the portion including a plurality of storage units;
   in response to the request, determining, by the memory controller, whether one or more storage units of the plurality of storage units included in the non-volatile memory device are programmed;
   pre-programming, by the memory controller, the portion of the non-volatile memory device if the one or more storage units of the plurality of storage units are determined to be programmed, wherein a number of programmed storage units does not exceed a determined value; and
   erasing, by the memory controller, the pre-programmed portion of the non-volatile memory device.

22. The method of claim 21, wherein each of the plurality of the storage units is a page, wherein a subset of the plurality of the storage units comprises a block, and wherein the portion of the non-volatile memory device includes one or more blocks.

23. The method of claim 21, wherein pre-programming the portion of the non-volatile memory device includes applying, by the memory controller, a first voltage level to the portion of the non-volatile memory device.

24. The method of claim 21, wherein the erasing the pre-programmed portion of the non-volatile memory device includes:
   applying, by the memory controller, a pulse having a second voltage level to the portion of the non-volatile memory device;
   determining, by the memory controller, whether the erasure of the portion of the non-volatile memory device is successful; and
   if the erasure of the portion of the non-volatile memory device is determined to be unsuccessful,
   incrementing, by the memory controller, the second voltage level by a determined increment value; and
   applying, by the memory controller, the pulse having the incremented second voltage level to the portion of the non-volatile memory device.

* * * * *